United States Patent
Benetti et al.

(10) Patent No.: US 11,274,360 B2
(45) Date of Patent: Mar. 15, 2022

(54) THIN FILM COATING AND METHOD OF FABRICATION THEREOF

(71) Applicant: PLASMIONIQUE INC., Brossard (CA)

(72) Inventors: Daniele Benetti, Montreal (CA); Riad Nechache, Montreal (CA); Henri Pepin, Pau (FR); Jennifer MacLeod, New Farm (AU); Federico Rosei, Montreal (CA); Rafik Nouar, Boucherville (CA); Andranik Sarkissian, Brossard (CA)

(73) Assignee: PLASMIONIQUE INC.

( * ) Notice: Subject to any disclaimer, the term of this patent is extended or adjusted under 35 U.S.C. 154(b) by 316 days.

(21) Appl. No.: 15/840,407

(22) Filed: Dec. 13, 2017

(65) Prior Publication Data
US 2019/0177834 A1    Jun. 13, 2019

(51) Int. Cl.
*C23C 14/08* (2006.01)
*C23C 14/34* (2006.01)
(Continued)

(52) U.S. Cl.
CPC ............ *C23C 14/086* (2013.01); *C23C 14/08* (2013.01); *C23C 14/083* (2013.01); *C23C 14/085* (2013.01); *C23C 14/345* (2013.01); *C23C 14/35* (2013.01); *C23C 14/352* (2013.01); *C23C 14/505* (2013.01); *C30B 23/02* (2013.01); *C30B 23/063* (2013.01); *C30B 29/16* (2013.01); *C30B 29/22* (2013.01); *H01J 37/32724* (2013.01);
(Continued)

(58) Field of Classification Search
CPC . C23C 14/3485; C23C 14/505; C23C 14/345; C23C 14/083; C23C 14/086; C23C 14/085; C23C 14/352; C23C 14/35; H01J 37/3405; H01J 37/3429; H01J 37/32724; H01L 21/02565; H01L 21/02414; H01L 21/0242; H01L 21/02631; C30B 23/02; C30B 29/22
See application file for complete search history.

(56) References Cited

U.S. PATENT DOCUMENTS

| 4,664,769 A * | 5/1987 | Cuomo ............ H01J 37/32321 204/192.1 |
| 5,234,561 A * | 8/1993 | Randhawa ............ C23C 14/325 204/192.12 |
| 6,033,741 A * | 3/2000 | Haruta .................... C23C 14/54 427/596 |

OTHER PUBLICATIONS

Jelinek, M.; Kocourek, T.; Kadlec, J.; Vorlicek, V.; Cernansky, M.; Studnicka, V.; Santoni, A.; Bohac, P.; Uherek, F. KrF laser deposition combined with magnetron sputtering to grow titanium-carbide layer. Thin Solid Films 506-507, p. 101-105. 2005. (Year: 2005).*

(Continued)

*Primary Examiner* — Michael A Band
(74) *Attorney, Agent, or Firm* — Lavery, De Billy, LLP; Gwendoline Bruneau

(57) ABSTRACT

A method and a system for film deposition, the system comprising a substrate and a negatively biased target, the target being mounted on a magnetron sputtering cathode and located at a distance from the substrate, wherein a laser beam from a pulsed laser is focused on the target, thereby triggering a magnetron plasma or ejecting vaporized and ionized material from the target in an existing magnetron plasma, the magnetron plasma sputtering material from the target depositing on the substrate.

4 Claims, 9 Drawing Sheets

(51) Int. Cl.

| | |
|---|---|
| C23C 14/35 | (2006.01) |
| C23C 14/50 | (2006.01) |
| C30B 23/02 | (2006.01) |
| C30B 29/16 | (2006.01) |
| C30B 29/22 | (2006.01) |
| H01J 37/32 | (2006.01) |
| H01J 37/34 | (2006.01) |
| H01L 21/02 | (2006.01) |
| C30B 23/06 | (2006.01) |

(52) U.S. Cl.
CPC ...... *H01J 37/3405* (2013.01); *H01J 37/3429* (2013.01); *H01L 21/02414* (2013.01); *H01L 21/02565* (2013.01); *H01L 21/02631* (2013.01); *C23C 14/3485* (2013.01); *H01L 21/0242* (2013.01)

(56) References Cited

OTHER PUBLICATIONS

Jones, J.; Muratore, C.; Waite, A.; Voevodin, A. Plasma diagnostics of hybrid magnetron sputtering and pulsed laser deposition. Surface & Coating Tehcnology 201, p. 4040-4045. 2006. (Year: 2006).*

Ashfold, M. N., Claeyssens, F., Fuge, G. M. & Henley, S. J. Pulsed laser ablation and deposition of thin films. Chem. Soc. Rev. 33, 23-31(2004).

Bulíř, J., Novotný, M., Jelínek, M., Kocourek, T. & Studnička, V. Plasma study and deposition of DLC/TiC/Ti multilayer structures using method combining pulsed laser deposition and magnetron sputtering. Surf. Coat. Technol. 200, 708-711, (2005).

Burmakov, A. P., Kuleshov, V. N. & Prokopchik, K. Y. Characteristic Features of the Formation of a Combined Magnetron-Laser Plasma in the Processes of Deposition of Film Coatings. Journal of Engineering Physics and Thermophysics 89, 1271-1276, (2016).

Chrisey, D. B. & Hubler, G. H. Pulsed Laser Deposition of Thin Films. John Wiley & Sons, Inc. (1994).

Craciun, V., Elders, J., Gardeniers, J. G. E. & Boyd, I. W. Characteristics of high quality ZnO thin films deposited by pulsed laser deposition. Appl. Phys. Lett. 65, 2963 (1994).

De Giacomo, A., Shakhatov, V., Senesi, G. S. & Orlando, S. Spectroscopic investigation of the method of plasma assisted pulsed laser deposition of titanium dioxide. Spectrochim. Acta B 56, 1459-1472 (2001).

Dietsch, R., Holz, T., Weißbach, D. & Scholz, R. Large area pulsed laser deposition (PLD) of nanometer-multilayers. Appl. Surf. Sci. 197-198, 169-174 (2002).

Diserens, M., Patscheider, J. & Levy, F. Mechanical properties and oxidation resistance of nanocomposite TiN-SiN x physical-vapor-deposited thin films. Surf. Coat. Technol. 121, 158-165 (1999).

Dominé, D., Haug, F. J., Battaglia, C. & Ballif, C. Modeling of light scattering from micro- and nanotextured surfaces. J. Appl. Phys. 107, 044504 (2010).

Endrino, J. L., Nainaparampil, J. J. & Krzanowski, J. E. Microstructure and vacuum tribology of TiC—Ag composite coatings deposited by magnetron sputtering-pulsed laser deposition. Surf. Coat. Technol. 157, 95-101 (2002).

Helmersson, U., Lattemann, M., Bohlmark, J., Ehiasarian, A. P. & Gudmundsson, J. T. Ionized physical vapor deposition (IPVD): A review of technology and applications. Thin Solid Films 513, 1-24 (2006).

Hunter, C. N., Check, M. H., Muratore, C. & Voevodin, A. A. Electrostatic quadrupole plasma mass spectrometer measurements during thin film depositions using simultaneous matrix assisted pulsed laser evaporation and magnetron sputtering. Journal of Vacuum Science & Technology A: Vacuum, Surfaces, and Films 28, 419-424, (2010).

Jelínek, M. et al. KrF laser deposition combined with magnetron sputtering to grow titanium-carbide layers. Thin Solid Films 506-507, 101-105, (2006).

Jelinek, M., Kocourek, T., Zemek, J., Novotný, M. & Kadlec, J. Thin SiC x layers prepared by hybrid laser-magnetron deposition. Appl. Phys. A 93, 633, (2008).

Kelly, P. & Arnell, R. Magnetron sputtering: a review of recent developments and applications. Vacuum 56, 159-172 (2000).

Kienzle, P. Nist Center for Neutron Research. Neutron activation and scattering calculator, www.ncnr.nist.gov/resources/activation/ (2014).

Kim, K. S. et al. Large-scale pattern growth of graphene films for stretchable transparent electrodes. Nature 457, 706-710 (2009).

Klotzbücher, T., Mergens, M., Wesner, D. A. & Kreutz, E. W. C—BN thin film formation in a hybrid r.f.—PLD method. Diamond Relat. Mater. 6, 599-603, (1997).2432.

Klotzbücher, T., Scherge, M., Mergens, M., Wesner, D. A. & Kreutz, E. W. Deposition of carbon nitride thin films in a hybrid r.f.—PLD method. Surf. Coat. Technol. 98, 1072-1078, (1998).

Li, X. et al. Large-area synthesis of high-quality and uniform graphene films on copper foils. Science 3893, 1312-1315 (2009).

Lorenz, M. et al. Large-area double-side pulsed laser deposition of YBa2Cu3O7-x thin films on 3-in. sapphire wafers. Appl. Phys. Lett. 68, 3332-3334 (1996).

Lowndes, D. H., Geohegan, D. B., Puretzky, A. A., Norton, D. P. & Rouleau, C. M. Synthesis of novel thin-film materials by pulsed laser deposition. Science 273, 898-903 (1996).

Nechache, R. et al. Epitaxial thin films of the multiferroic double perovskite Bi2FeCrO6 grown on (100)-oriented SrTiO3 substrates: Growth, characterization, and optimization. J. Appl. Phys. 105, 061621 (2009).

Nechache, R. et al. Epitaxial patterning of Bi2FeCrO6 double perovskite nanostructures: multiferroic at room temperature. Adv. Mater. 23, 1724-1729 (2011).

Nechache, R. et al. Photovoltaic properties of Bi2FeCrO6 epitaxial thin films. Appl. Phys. Lett. 98, 202902 (2011).

Nechache, R., Harnagea, C. & Pignolet, A. Multiferroic properties-structure relationships in epitaxial Bi2FeCrO6 thin films: recent developments. J Phys Condens Matter 24, 096001 (2012).

Nechache, R. & Rosei, F. Recent progress in nanostructured multiferroic Bi2FeCrO6 thin films. J. Solid State Chem. 189, 13-20 (2012).

Nelson, A. Co-refinement of multiple-contract neutron/X-ray reflectivity data using MOTOFIT. J. Appl. Cryst.39, 273-276 (2006).

Novotný, M., Bulíř, J., Lančok, J. & Jelínek, M. A Comparison of Plasma in Laser and Hybrid Laser-Magnetron SiC Deposition Systems. Plasma Processes and Polymers 4, S1017-S1021 (2007).

Paraguay, D. F., Estrada, L. W. & Acosta, N. D. Growth, structure and optical characterization of high quality ZnO thin films obtained by spray pyrolysis. Thin Solid Films 350, 192-202 (1999).

Riabinina, D., Chaker, M. & Rosei, F. Correlation between plasma dynamics and porosity of Ge films synthesized by pulsed laser deposition. Appl. Phys. Lett. 89, 131501 (2006).

Sankur, H. O. & Gunning, W. Deposition of optical thin films by pulsed laser assisted evaporation. Appl. Opt. 28, 2806-2808 (1989).

Schiller, S. et al. Pulsed magnetron sputter technology. Surf. Coat. Technol. 61, 331-337 (1993).

Voevodin, A., Capano, M., Safriet, A., Donley, M. & Zabinski, J. Combined magnetron sputtering and pulsed laser deposition of carbides and diamond-like carbon films. Appl. Phys. Lett. 69, 188-190 (1996).

Voevodin, A. A., Capano, M. A., Laube, S. J. P., Donley, M. S. & Zabinski, J. S. Design of a T/TiC/DLC functionally gradient coating based on studies of structural transitions in Ti—C thin films. Thin Solid Films 298, 107-115 (1997).

Voevodin, A. A., Hu, J. J., Jones, J. G., Fitz, T. A. & Zabinski, J. S. Growth and structural characterization of yttria-stabilized zirconia-gold nanocomposite films with improved toughness. Thin Solid Films 401, 187-195, (2001).

Willmott, P. & Huber, J. Pulsed laser vaporization and deposition. Rev. Mod. Phys. 72, 315-328 (2000).

Xi, J. Q. et al. Optical thin-film materials with low refractive index for broadband elimination of Fresnel reflection. Nat Photon 1, 176-179 (2007).

(56) References Cited

OTHER PUBLICATIONS

Yasaka, M. X-ray thin-film measurement methods. The Rigaku Journal 26 (2010).

* cited by examiner

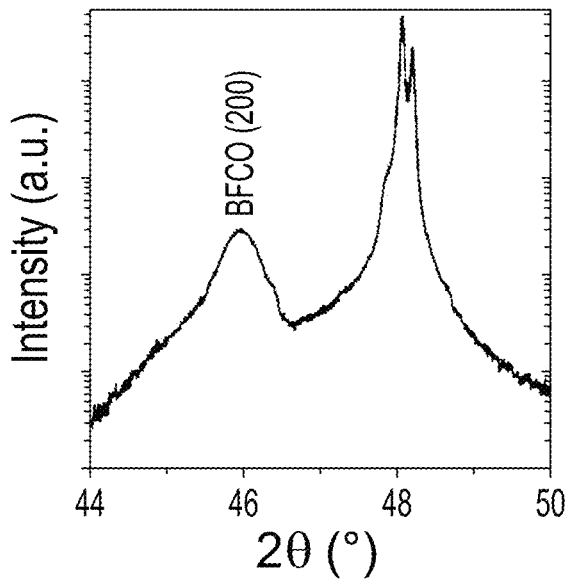
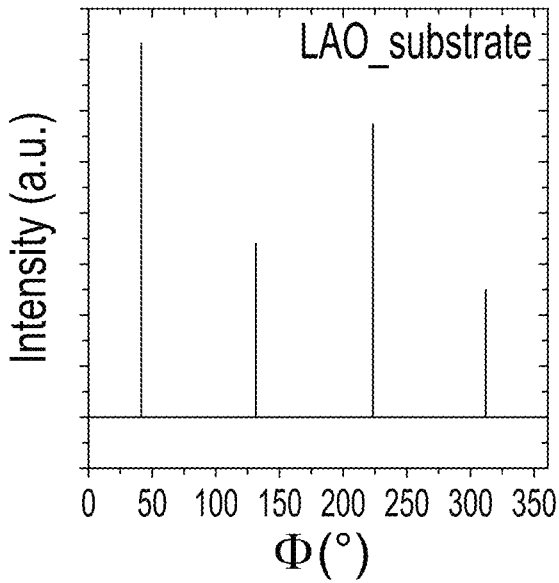
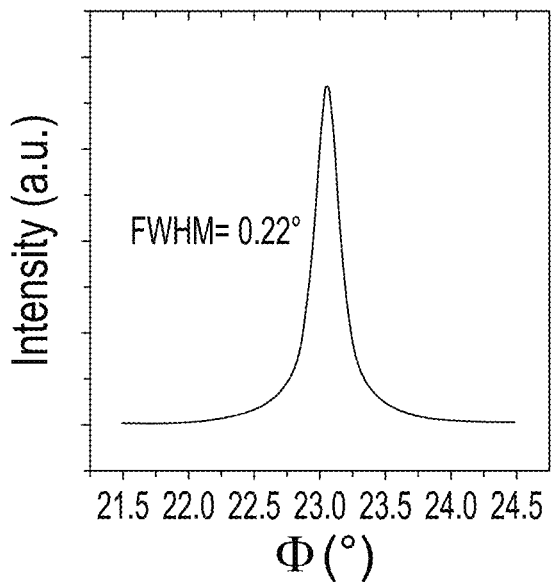
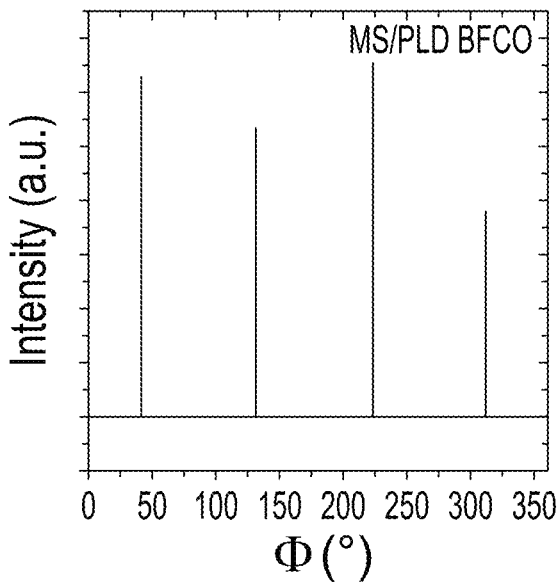

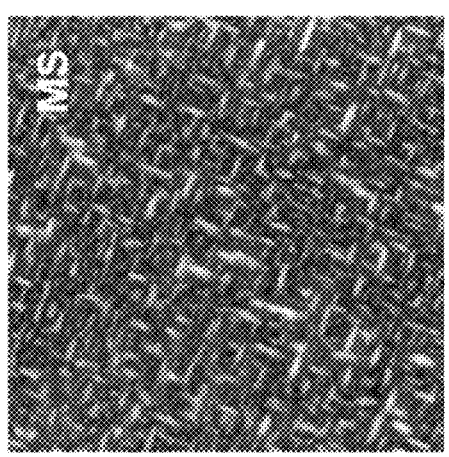
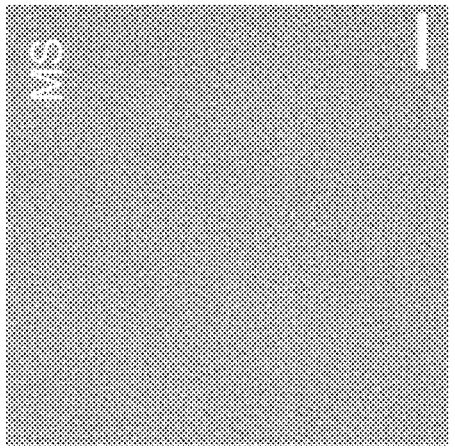
FIG. 7A FIG. 7D
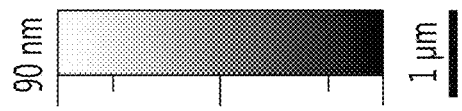
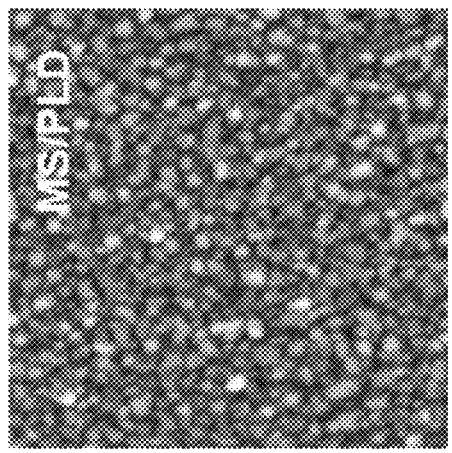
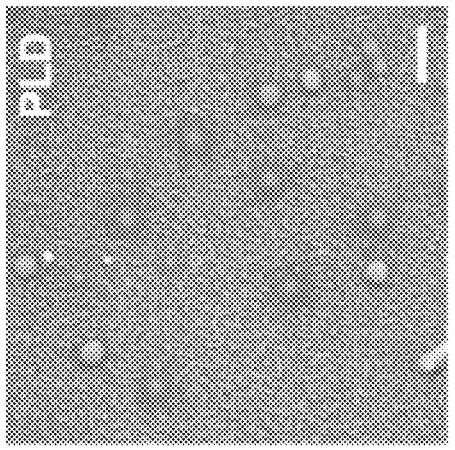
FIG. 7B FIG. 7E
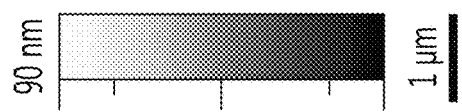
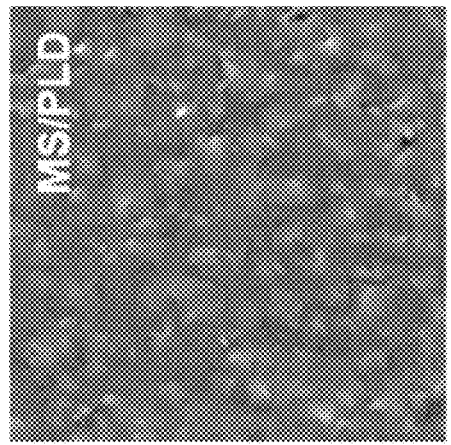
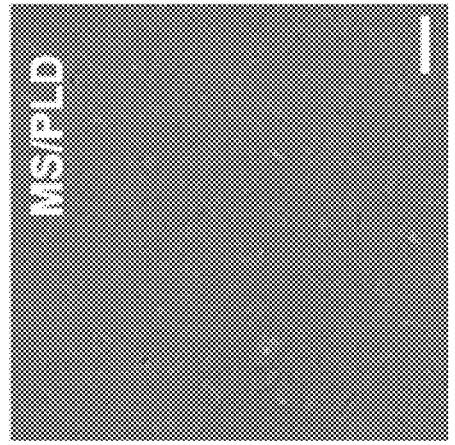
FIG. 7C FIG. 7F

THIN FILM COATING AND METHOD OF FABRICATION THEREOF

FIELD OF THE INVENTION

The present invention relates to thin film coatings. More particularly, the present invention relates to thin film coatings and a method of fabrication thereof.

BACKGROUND OF THE INVENTION

A number of methods may be used to grow thin films, some of which allowing tailoring the structure of the grown films to optimize optical, electrical, tribological and other properties [1, 2, 3, 4], which are found to be dependent on the density, the surface morphology [5, 6] and the crystallographic structure of the films.

Physical vapor deposition (PVD) methods for thin film deposition have found widespread use in many industrial sectors.

Magnetron sputtering (MS) is a physical vapor deposition method that is widely used to deposit and/or synthesize highly uniform and smooth films [7] on large surface areas for a number of applications. The deposition process may be controlled by selecting the applied power, the sputtering gas composition and the operation pressure typically in the few to tens of mTorr range.

Pulsed laser deposition (PLD) is another physical vapor deposition method for thin film deposition and synthesis [1, 8, 9, 10], which can be applied at any pressure, therefore offering more versatility. Like magnetron sputtering (MS), controlling the background pressure and the substrate-to-target distance allows controlling the density and structure of the deposited film [11]. However, despite its popularity and widespread use within the research community, the pulsed laser deposition method has not been widely adapted yet as a common industrial method, because of some challenges related to scaling up for large-area deposition, and formation of clusters that often occur during the ablation process [8, 9], which may result in undesired inhomogeneity and roughness of the deposited films. Although reduction of the pulsed laser energy density helps to reduce or eliminate macroparticles formation, it also lowers the deposition rate. Reducing the laser pulse duration reduces the ablation threshold, allowing ablation with less energy density per pulse.

Several approaches and methods have been developed to address these challenges relating to film quality in both magnetron sputtering and pulsed laser deposition methods [12, 13, 14]. Unbalanced magnetron sputtering [15], high power impulse magnetron sputtering (HIPIMS) [16], and plasma assisted pulsed laser deposition [17] are among recent developments that are being studied to improve certain characteristics of the deposited films. Different mechanisms are also proposed and demonstrated to extend the application of pulsed laser deposition to larger surface areas [18, 19].

A hybrid magnetron sputtering/pulsed laser deposition hybrid method (MSPLD) combining magnetron sputtering and pulsed laser deposition has been developed, using two targets. A first target is used for sputtering and a second target is used for pulsed laser deposition, and both targets may be used simultaneously [20-24]. This hybrid magnetron sputtering/pulsed laser deposition hybrid method was used for the preparation of functional gradient transition metal carbides and multilayer structures in TiC and diamond-like carbon (DLC) material systems as well as for other nanocomposites [25-29].

Another hybrid method combines pulsed laser deposition (PLD) with radio frequency (RF) sputtering at the substrate, using the applied radio frequency power to control film properties [30-31].

There is still a need in the art for thin film coatings and a method of fabrication thereof.

The present description refers to a number of documents, the content of which is herein incorporated by reference in their entirety.

SUMMARY OF THE INVENTION

More specifically, in accordance with the present invention, there is provided a system for film deposition, comprising, in presence of a sputtering gas, a substrate and a negatively biased target, the target being mounted on a magnetron sputtering cathode and located at a distance from the substrate, wherein a laser beam from a pulsed laser is focused on the target, thereby triggering a magnetron plasma or ejecting vaporized and ionized material from the target in an existing magnetron plasma, the magnetron plasma sputtering material from the target depositing on the substrate.

There is further provided a film deposition method, comprising focusing a high intensity pulsed laser beam on a negatively biased target positioned on a magnetron sputtering cathode and located at a distance from a substrate, in presence of a sputtering gas, thereby triggering a magnetron plasma or ejecting vaporized and ionized material from the target in an existing magnetron plasma, the magnetron plasma sputtering material from the target depositing on the substrate.

Other objects, advantages and features of the present invention will become more apparent upon reading of the following non-restrictive description of specific embodiments thereof, given by way of example only with reference to the accompanying drawings.

BRIEF DESCRIPTION OF THE DRAWINGS

In the appended drawings:

FIG. 6A shows a 2θ-scan of BFCO(002) peak;

FIG. 6B shows φ-scan measurements around the (200) reflection showing the epitaxial growth of the film;

FIG. 6C shows a rocking curve of BFCO(002) peak;

FIG. 6D shows s φ-scan measurements around the (200) reflection showing the epitaxial growth of the film;

FIG. 7A is an atomic force microscopy (AFM) image on an area of 5 μm×5 μm of BFCO on LAO(100) deposited with magnetron sputtering at 750° C.;

FIG. 7B is an atomic force microscopy (AFM) image on an area of 5 μm×5 μm of BFCO on LAO(100) deposited with a method according to an embodiment of an aspect of the present invention at 650° C.;

FIG. 7C is an atomic force microscopy (AFM) image on an area of 5 μm×5 μm of BFCO on LAO(100) deposited with a method according to an embodiment of an aspect of the present invention at 750° C.;

FIG. 7D is a scanning electron microscopy (SEM) image of a film prepared by magnetron sputtering deposition of BFCO on Si(100), the scale bar being 1 μm;

FIG. 7E is a scanning electron microscopy (SEM) image of a film prepared by pulsed laser deposition (PLD) of BFCO on Si(100), the scale bar being 1 μm;

FIG. 7F is a scanning electron microscopy (SEM) image of a film prepared with a method according to an embodiment of an aspect of the present invention on LAO (100) at 750° C., the scale bar being 1 μm;

DESCRIPTION OF ILLUSTRATIVE EMBODIMENTS

The present invention is illustrated in further details by the following non-limiting examples.

Figure 1A:
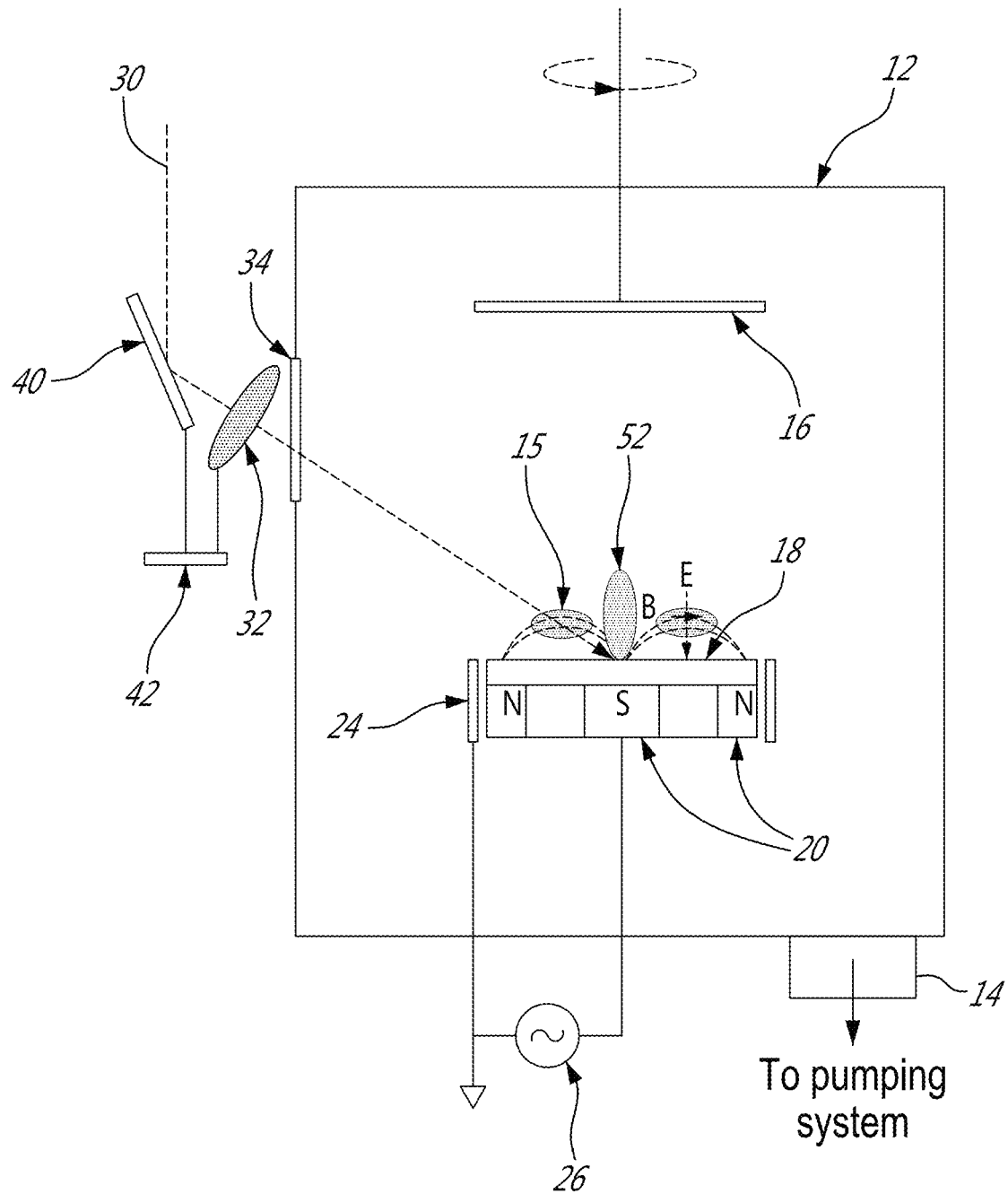
FIG. 1A is a schematical view of a system according to an embodiment of an aspect of the invention.

A system according to an embodiment of an aspect of the invention is illustrated for example in FIG. 1A comprising, in a chamber in presence of a sputtering gas, a substrate and a magnetron target.

The chamber 12 is shown with a port 14 used to evacuate the chamber 12 using a pumping system to a pressure below $10^{-3}$ Torr. Low residual pressure is desirable for impurity control. In experiments described herein, the residual pressure achieved was in a $10^{-6}$ Torr range, using a turbomolecular pump backed by a two stage mechanical pump, and for operation a sputtering gas pressure of a few mTorr, typically in the range about 0.8 mTorr and 20 mtorr.

The rotary substrate holder 16 may be heated to more than 850° C. if required, and may be electrically polarized using DC, AC or radiofrequency (RF) biasing method. The angle of the substrate holder 16 with respect to a direction perpendicular to a target 18 may be varied, from zero up to about 90 degrees.

The target 18 is mounted on the cathode of a magnetron within the chamber 12. The magnetron cathode is biased negatively with respect to its anode 24 using a power source 26, which may be a DC, a pulse DC, AC or a RF power source. The magnetron may be mounted on a rotary structure, as will be described hereinbelow.

Figure 1B:
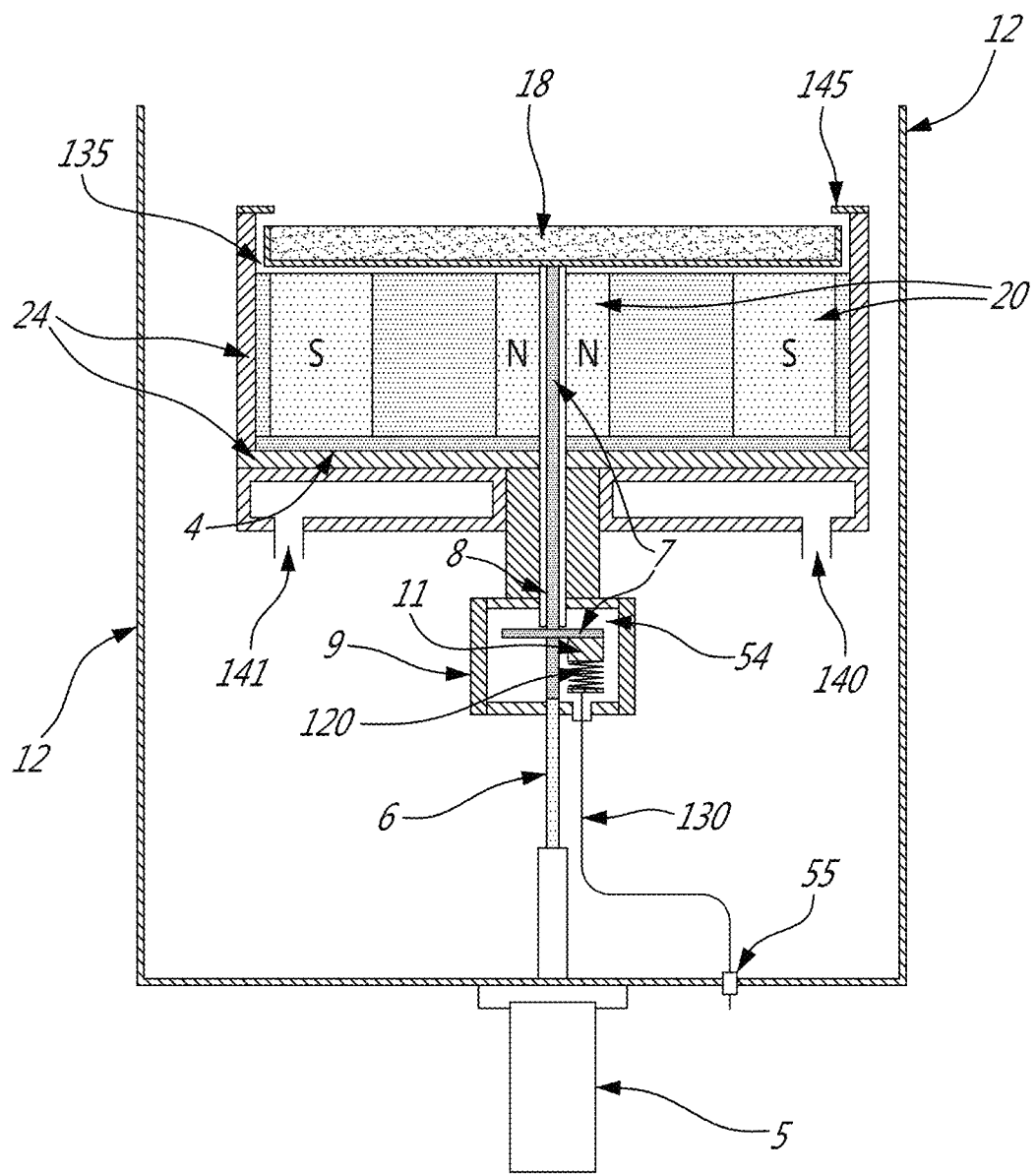
FIG. 1B is a schematical view of a system according to an embodiment of an aspect of the invention.

FIG. 1B shows a biased rotary pulsed laser deposition target 18, which may be operated with or without magnetic configuration of the magnetron.

The magnetron and its anode 24 are made from a non-magnetic metal. In and out water connections 140, 141 may be provided for cooling the magnetron magnets 20 and its anode 24.

A magnet holder assembly comprises a base 4 of the magnetron, which may be used for closing the magnetic field lines, and is typically made in a magnetic material. The base 4 comprises a through hole in a center thereof, for passage of a conductive bias rod 7 coupled to an electrical insulating rod 6, itself coupled to a rotary metallic rod of a rotary feed through 5; the conductive bias rod 7 connects to the target 18. The biased section 7 is insulated with an insulated sleeve 8.

A metallic assembly houses an electrical bias assembly 9, with insulating materials 54. Biasing in this case may be applied by an electrical brush contact 11, typically made of soft conducting materials, such as carbon, or Cu—Be alloy for example. A spring load 120 may be used for brush contact. A coaxial connector 130 connects the electrical bias assembly 9 to a bias connector 55. A ground of the coaxial cable (not shown in FIG. 1B) is connected to the housing of the electrical bias assembly 9 and the chamber 12.

Thus the magnet holder assembly allows passage of the conducting rotary rod 7 surrounded by a ceramic insulator 6 and connected to the center of the rotary target 18, the conducting rod 7 passing through a contact brush 11, the contact brush, 11 connected to a biasing cable 130, allowing biasing the conducting rotary rod 7 of the rotary target 18. The rotary conducting rod 7 is connected to the non-conducting rotary rod 6 before traversing the exit of the contact brush 11; this non-conducting rod 6 is connected to the rotary feedthrough 5, which transfers the rotation to the target 18.

A dark space shield 135 is provided by a gap equally spaced around the outer perimeter of the target 18, of a size d such that the product of the pressure by the size d is less than the magnetron discharge threshold, i.e. of at most about d=1 mm, thereby preventing magnetron discharge according to Paschen's Law. An extension 145 above the target 18 may be further provided for preventing sputtering from the target 18. The rotary target 18 is thus positioned above the magnet holder assembly having a magnetic field geometry of a plane magnetron as schematized in FIG. 1A.

As schematized in FIG. 1A, a laser beam 30 from a pulsed laser (not shown) is focused on the target 18 by a lens 32 through a window 34 of the chamber 12, such as a quartz window for example, transparent to the laser wavelength. Both lens 32 and window 34 may be coated with an antireflection coating to maximize laser beam energy transfer. A mirror 40 is provided on a holder mounted on a linear translator 42 that may change its position back and forth. Mirror 40 and lens 32 are mounted on a motorized translator unit. The laser beam 30 may be controlled to sweep the target 18 by indexing the angle of the mirror 40, and/or changing the position of the translator 42. Alternative setups could also be arranged. The laser beam 30 focused on the target 18 is selected to have an energy density above the ablation threshold of the material of the target 18. The target 18 thus produces a pulsed laser deposition plume 52.

A discharge in a magnetron is produced if enough gas is ionized. The perpendicular force field (F), F=E×B, Lorentz force field of the cross magnetic field (B) produced by the magnetron magnets 20 and biasing field (E) applied to the target 18, accelerates charged particles, particularly electrons, which ionize the sputtering gas by energy transfer in collisions. The electrons are trapped in the magnetic field B with a rotation radius r defined as $r=mv_p/qB$, where m is the mass, $v_p$ is perpendicular velocity component, q is the charge; however, ions due to their large mass, are considered not to be influenced significantly in the magnetic field B of the magnetron. Therefore ions are accelerated towards the target 18 by the field E and sputter material from the target 18. Additional sputtering from the target 18 results from ions generated by the laser produced plasma 52. The ions and ionized neutral particles generated by the plume 52 that detect the negative bias on the target 18 slow down and accelerate back to the target 18 and contribute to the sputtering process, thus increasing the efficiency of the sputter deposition process.

Thus, the electrons in the plasma plume 52 generated by the laser, following laser energy dissipation in the target material 18, are trapped by the magnetic field B produced by the magnetron magnets 20. The effect of the Lorentz force F on the electrons accelerates the electrons, and interaction of the electrons with the background sputtering gas within the chamber ionizes the sputtering gas, contributing to initiation or enhancement of a magnetron plasma discharge 15.

At low pressures of sputtering gas, typically, below a couple of mTorr range, i.e. in a range between about 0.8 mTorr and about 20 mTorr for example, in a range between about 0.8 mTorr and about 5 mTorr for example, where magnetrons cannot initiate and maintain a discharge due to lack of sufficient electrons, the laser produced plasma 52 acts as a discharge initiator for the magnetron. If the time between the laser pulses is short compared to the characteristic diffusion time for electrons trapped in the magnetic field B, a continuous or semi continuous magnetron plasma discharge, i. e. a discharge with modulated current amplitude, may be maintained at lower pressures, at pressures where a magnetron discharge is not otherwise feasible to initiate in a standard magnetron sputtering (MS) system.

The present system was found to increase the deposition rate due to i) an increased plasma sputtering rate resulting from ionization of the background gas, selected among inert gases or a mixture of inert and reactives gases, for example, such as argon for example, by additional trapped electrons in the magnetrons magnetic field, which are produced by the laser plume, and ii) ionized atoms produced by laser ablation. The generated ions that feel the negatively biased electric field on the target accelerate towards the target and thus increase the sputtering rate from the target.

The average power $P_{av-L}$ of the laser 30 is selected to be much smaller than the average power applied to the magnetron target $P_{av-M}$ ($P_{av-L} \ll P_{av-M}$). However, its impact on efficiency of the process is significant, as demonstrated by following examples.

In experiments presented herein, two different materials, namely $TiO_2$ and a multiferroic $Bi_2FeCrO_6$, were deposited on a Si (100) substrate. The experiments were carried out using a magnetron with a target 18 of a diameter of 1". The power applied was 35 W, which corresponds to an average power density of about 7 $W/cm^2$. The laser 30 was an excimer laser operated at 248 nm, 10 Hz, the duration of the laser pulses was 15 ns, and the average power applied by the laser was 0.56 W. Deposition was done at different pressures of argon gas: about 1 mTorr, about 5 mTorr and about 40 mTorr. While oxygen is generally included in the sputtering gas mix in a ratio between 0 and 100% in reactive depositions of oxides, pure argon was used in the present experiments. For $TiO_2$ film deposition, in addition to the oxygen in the target material, by water vapor adsorbed on the inner surface of the walls of the chamber 12, when the chamber 12 is exposed to atmosphere, which also provides a source of oxygen.

Figures 2A, 2B, 2C:
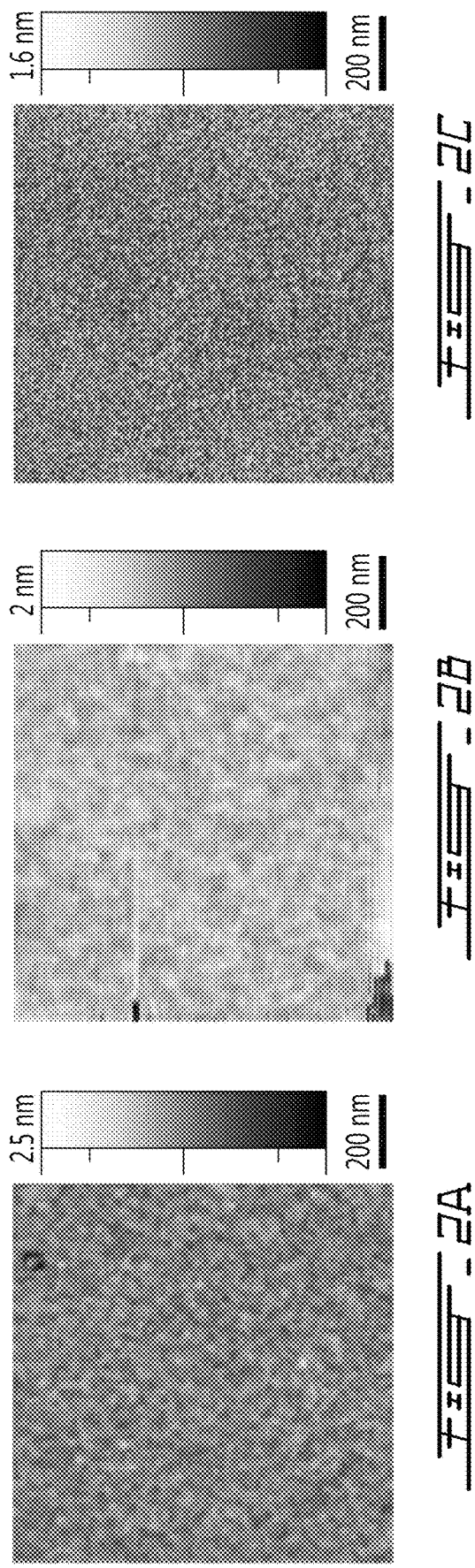
FIG. 2A is an atomic force microscopy (AFM) image, on an area of 1 μm×1 μm, of a $TiO_2$ film formed by magnetron sputtering (MS)
FIG. 2B is an atomic force microscopy (AFM) image, on an area of 1 μm×1 μm, of a $TiO_2$ film formed by pulsed laser deposition (PLD)
FIG. 2C is an atomic force microscopy (AFM) image, on an area of 1 μm×1 μm, of a $TiO_2$ film formed by a method according to an embodiment of an aspect of the present invention.

FIG. 2 show atomic force microscopy (AFM) images of $TiO_2$ films obtained with magneton sputtering (FIG. 2A), pulsed laser deposition (FIG. 2B), and a method according to an embodiment of an aspect of the present invention (FIG. 2C), at an operating pressure of 5 mTorr.

Figure 3B:
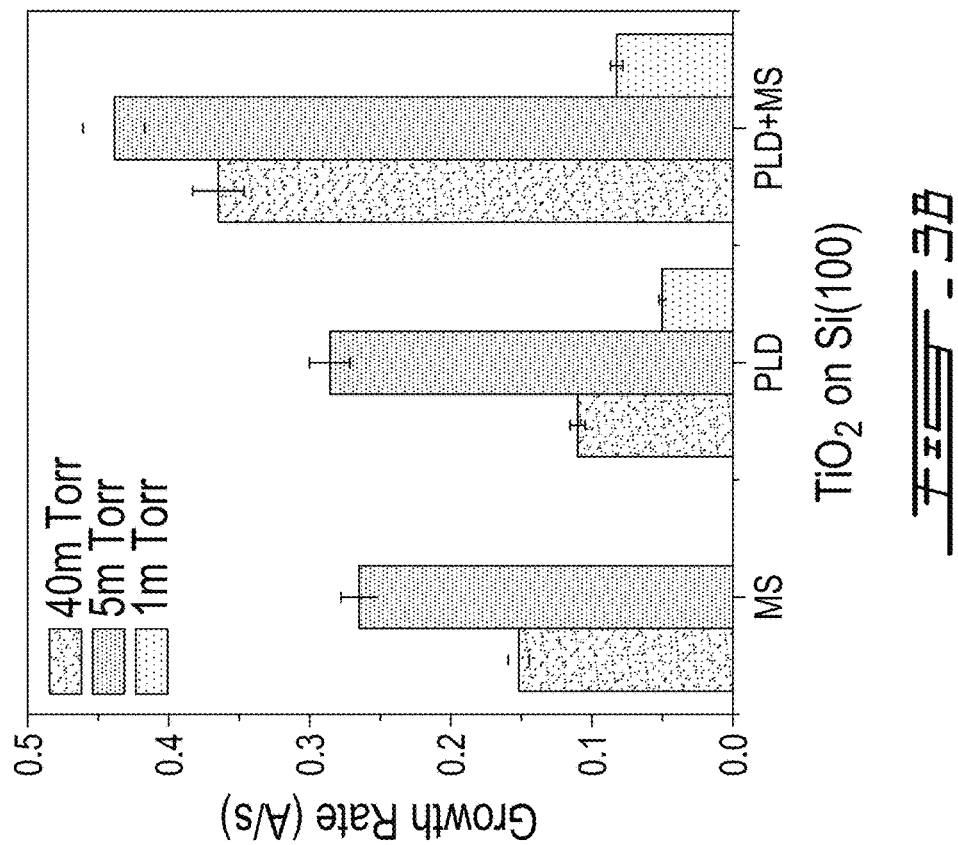
FIG. 3B shows the growth rate of the $TiO_2$ films as a function of argon pressure.
Figure 3A:
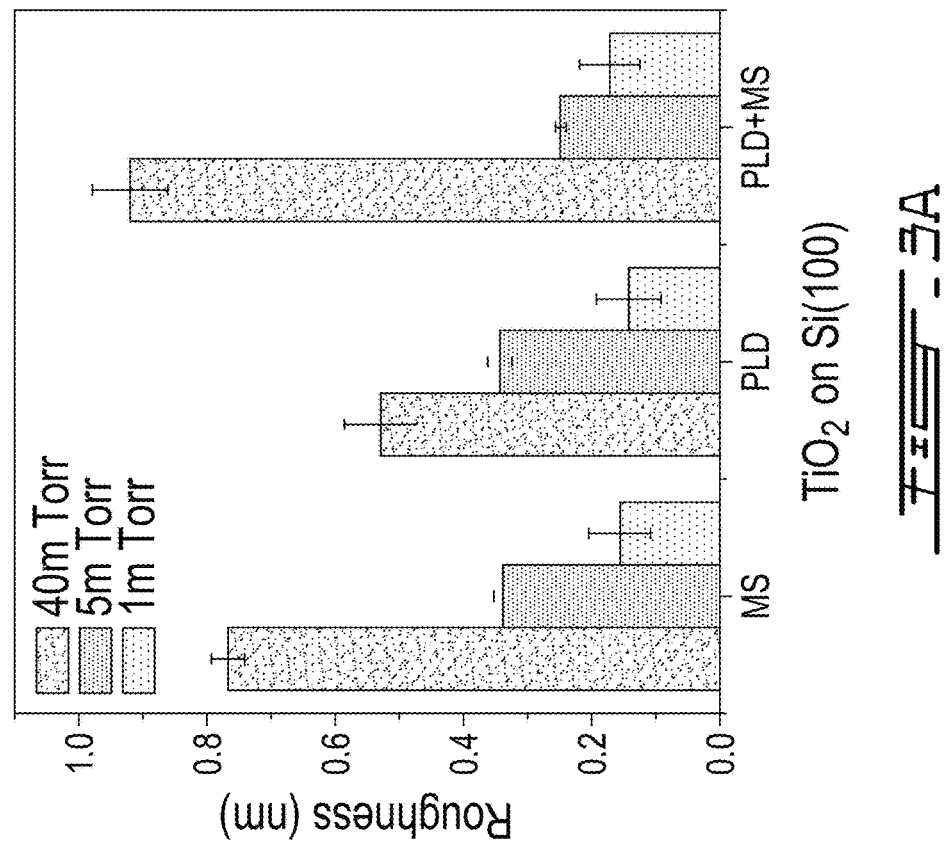
FIG. 3A shows atomic force microscopy-measured roughness of 5 μm×5 μm $TiO_2$ films as a function of argon pressure.

FIG. 3 show morphological parameters of $TiO_2$ films on a Si (100) substrate obtained at 1, 5 and 40 mTorr of argon gas. As can be seen in FIG. 3A, regardless of which deposition method was used, the surface roughness of the $TiO_2$ films decreases with decreasing argon pressure. At higher pressure the surface mobility of the deposited species is significantly reduced due to the fact that they lose their energy through collisions with background gas molecules, before reaching the substrate. As a result, the atoms deposited on the substrate formed grains having an average lateral size of 35±4 nm. As can be seen in FIG. 3B, optimum results in terms of maximizing growth rate while minimizing surface roughness were obtained at a pressure of 5 mTorr. Although at 1 mTorr, the film was slightly smoother (see FIG. 3A), at low pressure, the sputtering rate is lower due to lower ion density of background gas in the magnetron discharge. Due to time limitations, a pressure of 5 mTorr was used herein. At 5 mTorr, the present hybrid method consistently operated at a higher growth rate (+50%) and low roughness values: deposited films were about two times smoother than in the case when films were deposited by magneton sputtering (MS) alone under the same operating pressures and power.

At 5 mTorr, the present hybrid method consistently operated at a higher growth rate (~50%). Results from growth rate for magneton sputtering (MS) and pulsed laser deposition (PLD) suggests the film thickness after one hour of operation with each method, thus for two hours in total deposition time, a film of a thickness of about 201 nm would be achieved, wherein the present method and system achieved in one hour a film of a thickness of about 162 nm; so if operated for the same time, i.e. 2 hrs, the present method and system would achieve a film of a thickness of about 320 nm as compared to 201 nm.

Figure 4A:
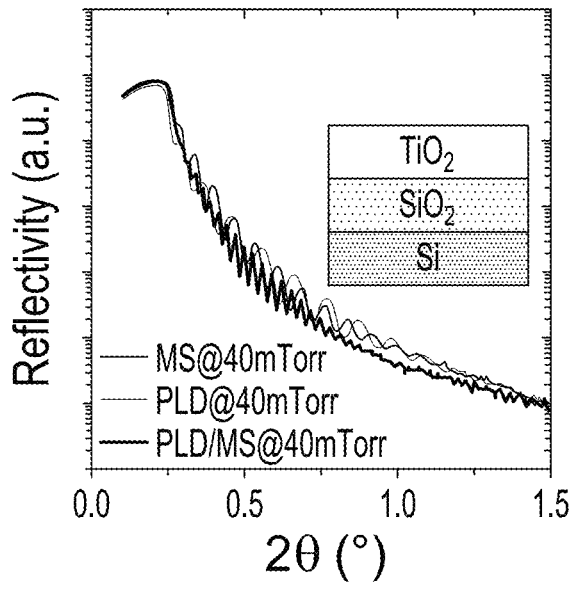
FIG. 4A shows X-ray reflectivity (XRR) of samples deposited at 40 mTorr with the three different methods of FIGS. 2A-C.
Figure 4B:
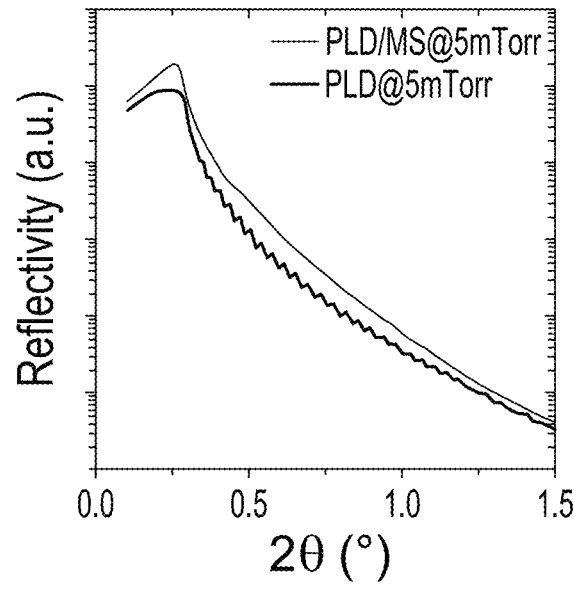
FIG. 4B shows X-ray reflectivity of samples deposited at 5 mTorr by pulsed laser deposition (PLD) and by a method according to an embodiment of an aspect of the present invention.
Figure 4C:
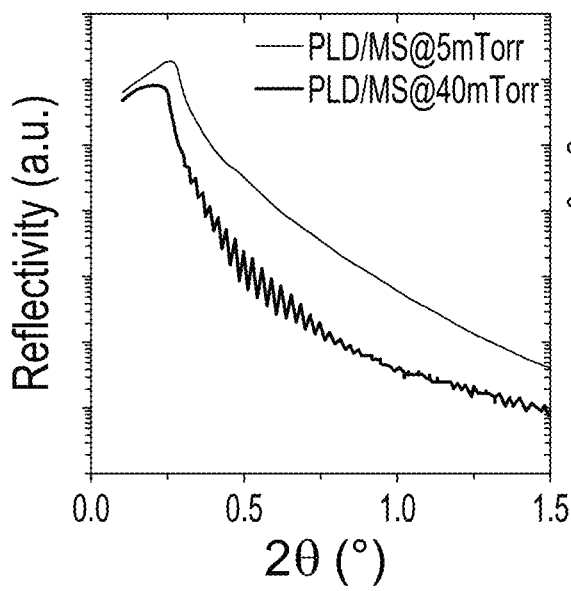
FIG. 4C shows a comparison of samples deposited with a method according to an embodiment of an aspect of the present invention, at 5 and 40 mTorr.

FIG. 4 show X-Ray reflectivity of $TiO_2$ samples grown on Si (100) using different pressures and deposition methods; in the inset of FIG. 4A the model used for fitting the data is shown, in which a thin layer of SiO$_2$ (size not to scale) was added between the TiO$_2$ and Si layers, to account for the presence of a thin native oxide layer at the surface. In X-ray reflectivity (XRR), the period of oscillation depends on the film thickness, with shorter periods indicating thicker films [32]. X-ray reflectivity (XRR) data also indicate a critical angle, $\theta_c$, which is related to the density of the film. For $\theta < \theta_c$ total reflection occurs, whereas above $\theta_c$, X-ray reflectivity (XRR) decreases rapidly with increasing incident angle. In FIG. 4B it is possible to observe a larger critical angle for films deposited with the present hybrid method at 5 mTorr, indicating that they have a higher density compared to films deposited otherwise.

On average, slower decays in reflectivity were observed for the samples grown with the present hybrid method, indicating that the surface roughness is smaller. An exception is the sample obtained at 40 mTorr with the hybrid method, which had the largest X-ray reflectivity (XRR)-determined roughness, consistent with atomic force microscopy (AFM) measurements. In general at higher pressure the surface mobility of diffusing species is reduced due to reduced energy of impinging particles, leading to rougher surfaces.

Figure 4D:
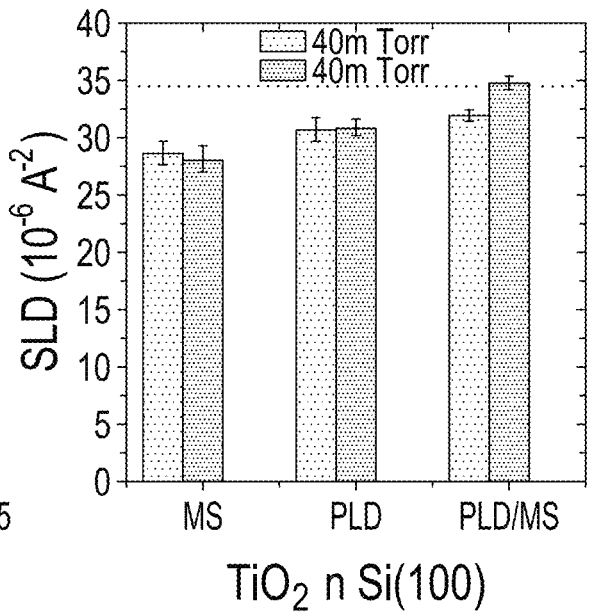
FIG. 4D shows scattering length density values for $TiO_2$ layers deposited with the magnetron sputtering method, the pulsed laser deposition and a method according to an embodiment of an aspect of the present invention at two different pressures, 5 and 40 mTorr; the horizontal dashed line represents the tabulated scattering length density (SLD) of bulk $TiO_2$ ($34.46 \times 10^{-6}$ $Å^{-2}$) [21]

FIG. 4D shows the scattering length density (SLD) obtained from analysis of the X-ray reflectivity (XRR) data for TiO$_2$ layers obtained at 40 mTorr and 5 mTorr. The scattering length density (SLD) is directly related to the density of the film, with higher values indicating more tightly packed scattering entities. This analysis reveals that independently of the deposition pressure, the hybrid method produces films with 15-25% higher scattering length density (SLD) than magneton sputtering (MS) alone. At the optimal pressure of 5 mTorr in this example, the film has the highest value of scattering length density (SLD), which is similar to the tabulated value for bulk TiO$_2$ (34.8 vs 34.5 $10^{-6}$ Å$^{-2}$) [33]. It is to be noted that that this optimal value may vary with the distance between the target and the substrate, as well as with the power, size and shape of the chamber.

The hybrid method was also used to fabricate multiferroic double perovskite Bi$_2$FeCrO$_6$ (BFCO) films on LAO(100), with the aim of demonstrating epitaxial growth of multiferroic films, since epitaxial growth is necessary to control the crystalline phase and cation ordering of BFCO, which are linked to its functional properties [34]. Through a systematic variation of parameters, optimum growth conditions for epitaxial growth of double perovskite Bi$_2$FeCrO$_6$ (BFCO) were determined as corresponding to a temperature of about 750° C. and pressure of about 10 mTorr range. The applied power density on magnetron was 6 W/cm2 (30 W RF power on 1" target) and average laser power was 4.4 W.

Figure 5:
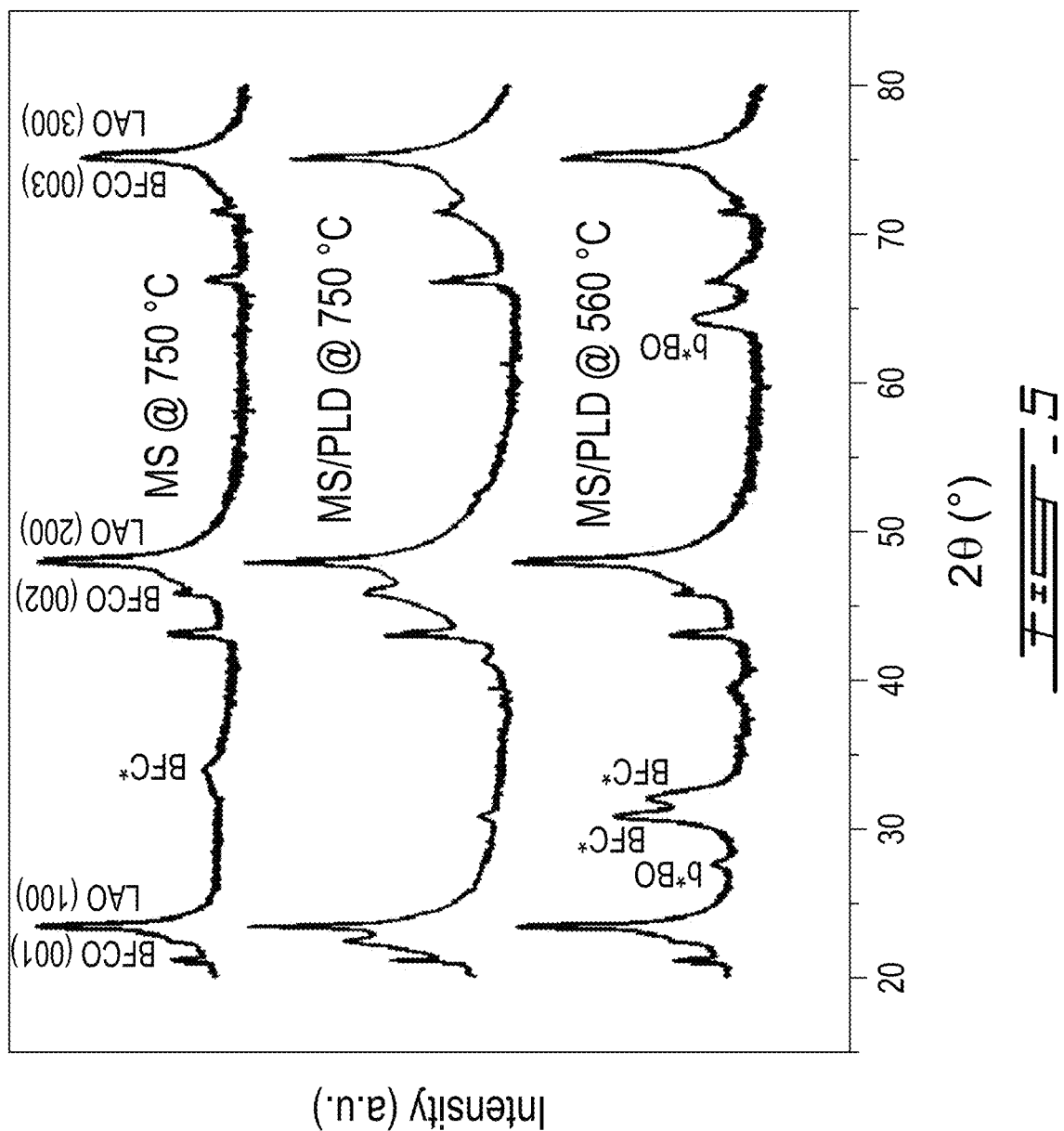
FIG. 5 shows X-ray reflectivity of double perovskite Bi2FeCrO6 (BFCO) samples on LAO (100), prepared by magnetron sputtering (MS), and by a method (MS/PLD) according to an embodiment of an aspect of the present invention at 750° C. and 560° C.

As was discussed hereinabove in relation with TiO$_2$ films, the double perovskite Bi$_2$FeCrO$_6$ (BFCO) films obtained with the hybrid method of the present invention presented a smooth surface, with a RMS roughness of less than 6 nm measured by atomic force microscopy (AFM) (see FIG. 7C). To evaluate the crystallinity of the samples, X-ray powder diffraction (XRD) was performed. Diffraction from films grown on LAO (100) is shown in FIG. 5. The sample made with the present hybrid MS/PLD method at 750° C. on LAO (100) produced only diffraction peaks from the substrate and the BFCO layer. Only the 00l (l=1, 2, 3) cubic reflections of the films are visible, indicating that the films are highly (001)-oriented, as reported in references [35-37] and confirm the epitaxial growth of the films.

FIG. 6 show rocking curves and φ-scan of BFCO layers grown at 750° C. Rocking curve measurements shown in FIG. 6C reveal the highly crystalline quality of the BFCO layers, with a full width half maximum (FWHM) of 0.2° around BFCO (002). The epitaxial ordering of BFCO using the present hybrid MS/PLD method is confirmed by the diffraction pattern analysis (φ-scan) reported in FIGS. 6B and 6D, in which a fourfold symmetry of the epitaxial relationship between the BFCO layer and the LAO substrate is observed.

The films grown at 560° C. using the present hybrid MS/PLD method (see FIG. 5) exhibit additional reflections that can be attributed to the presence of Bi-rich phases [36-38]. These films also have a higher RMS roughness value (of about 12 nm), and atomic force microscopy (AFM) shows large particles 196±50 nm in lateral size and 48±19 nm in height uniformly covering the surface (FIG. 7B).

For films fabricated using only sputtering (MS), the result was similar: non-epitaxial growth with some secondary phases (BFC), as indicated in the diffractogram (FIG. 5). Atomic force microscopy (AFM) data obtained from these films show elongated structures with grains of about 290±63 nm in lateral size and about 14±5 nm in height (FIG. 7A).

The differences between the magneton sputtering (MS) and the pulsed laser deposition (PLD) methods for BFCO on Si (100) are clearly visible in the SEM images of FIGS. 7D and 7E. The film deposited with pulsed laser deposition (PLD) contains droplets with a lateral size of about 480±76 nm and height of 100 nm, whereas the film grown by magneton sputtering (MS) is uniform and has a much finer-grained FIG. 7F shows the film grown with the present hybrid MS/PLD method on LAO (100): in general the film is uniform, with occasional grains visible on the surface.

Figure 8A:
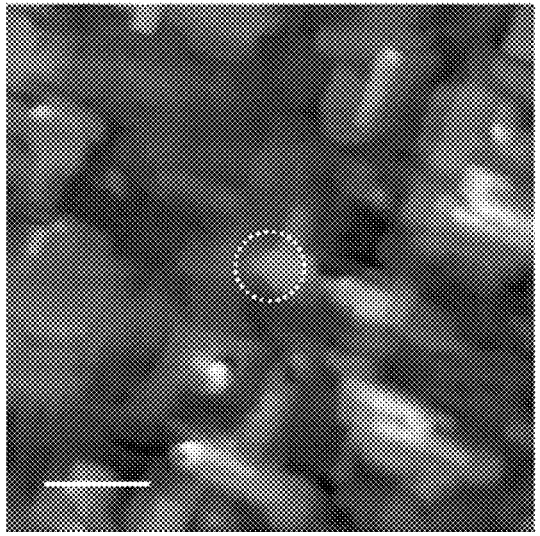
FIG. 8A is a contact topography atomic force microscopy image (area 2 μm×2 μm) of BFCO produced with a method according to an embodiment of an aspect of the present invention.
Figure 8B:
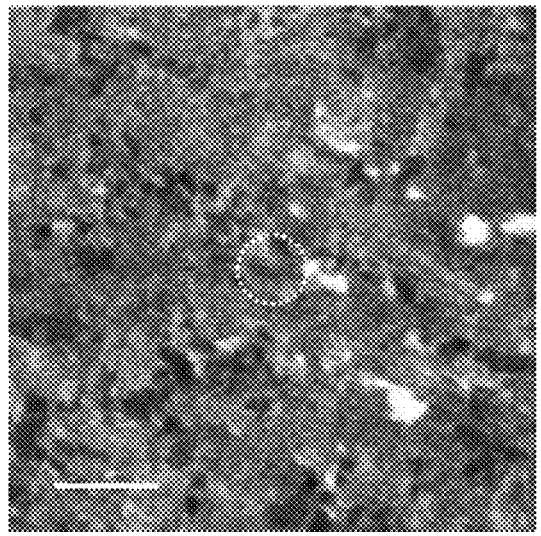
FIG. 8B is an out-of-plane piezoresponse force microscopy (PFM) image simultaneously recorded with FIG. 8A.
Figure 8C:
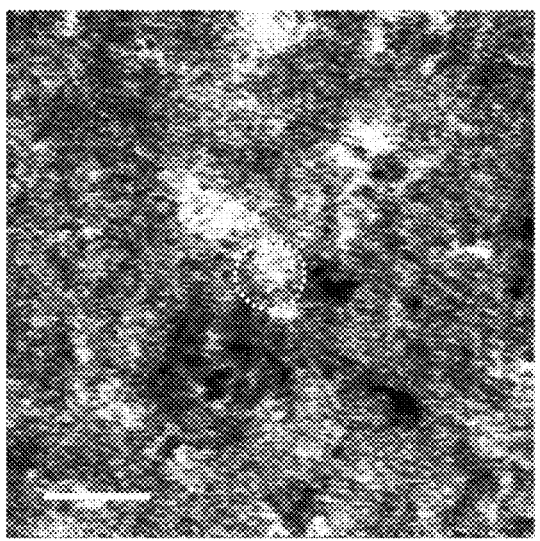
FIG. 8C is an in-plane piezoresponse force microscopy (PFM) image simultaneously recorded with FIGS. 8A and 8B.
Figure 8D:
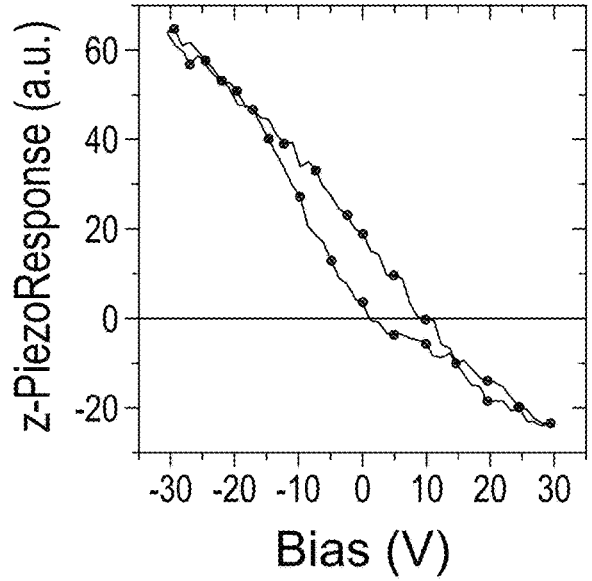
FIG. 8D is a piezoresponse hysteresis loop recorded from the area highlighted by the dotted circle of FIGS. 1A-8C.

In order to verify that the present hybrid MS/PLD method produced a functional BFCO thin film, its ferroelectric properties were investigated by piezoresponse force microscopy (PFM) in several randomly chosen areas. Representative piezoresponse force microscopy (PFM) images of the ferroelectric domains in epitaxial BFCO obtained by the present hybrid MS/PLD method are shown in FIG. 8. The out-of-plane and in-plane components of the piezoresponse force microscopy (PFM) signal are simultaneously recorded together with topography (FIGS. 8A-8C). In general, for the out-of-plane measurement (FIG. 8B), light areas indicate regions with the z-components of spontaneous polarization oriented upwards while darker areas connote a polarization component oriented in the opposite direction, downwards. In the in-plane measurement, the different shades indicating opposite lateral components of the spontaneous polarization. FIG. 8D shows the piezo-response hysteresis loop of the out-of-plane component recorded from the area highlighted in FIGS. 8A and 8B. In FIG. 8D, the in-plane hysteresis loop recorded on the same area is also shown. The existence of hysteresis loops confirm the presence of a switchable ferroelectric polarization, hence confirming the ferroelectric character of the Bi2FeCrO6 (BFCO) films produced by the present hybrid MS/PLD method [36, 38]. A similar investigation on films produced by pulsed laser deposition (PLD) and magneton sputtering (MS) alone was carried out but no piezoresponse was observed (FIG. 8D), confirming that the present hybrid MS/PLD method was able to produce a functional BFCO film.

Deposition of TiO$_2$, which is a widely studied semiconducting material with attractive characteristics such as a high refractive index, wide band gap, and photocatalytic properties, was thus demonstrated.

The present system and method was also demonstrated with diode pumped lasers operating at 1064 nm and 355 nm, with 6 to 8 ps pulse durations, operating at 400 Hz with average power of less than 0.2 W and 0.06 W respectively. Deposition of $BiFe_xC_{(1-x)}O_3$, or double perovskite $Bi_2FeCrO_6$ (BFCO), which is of interest due to its multiferroic and photovoltaic behaviors, when deposited on a suitable substrate, including but not limited to $LaAlO_3$ (LAO) under optimized conditions, was also demonstrated.

There is thus provided a hybrid deposition method, comprising magneton sputtering (MS) and pulsed laser (PLD) using a single target for both magneton sputtering (MS) and pulsed laser deposition (PLD), for deposition of a range of materials, simple or complex, such as for example oxides, nitrides, perovskites, etc, at low pressure, i.e. typically in a range between about 1 mTorr and about 20 mTorr. Moreover, using the pulsed laser to trigger and maintain the magnetron discharge at lower pressures and contribution of the ions produce by laser ignited plasma plume to the sputtering process provides a control mechanism for tuning the deposited film structure and deposition efficiency.

The method comprises applying short laser pulses to a standard magnetron cathode (FIG. 1A) or a modified magnetron design with rotating target (FIG. 1B). The average pulse energy is much smaller than the power applied to the magnetron cathode, thereby resulting in reducing the breakdown voltage requirement for the magnetron, allowing operation at lower pressures, which results in denser films. The method further allows epitaxial deposition of complex composite much faster than methods such as molecular beam epitaxy (MBE). The method may be applied to a biased pulsed laser deposition (PLD) target, with or without magnetic field.

For BFCO, the pressure was 10 mTorr, temperature was 750° C., the laser power was 4.4 W and the magnetron power was 30 W, the target was 1", giving a power density of 6 W/cm².

Compared to a power in a range between 25 W and 60 W applied in the case of the standard magneton sputtering (MS) method, the average power of laser is comprised in the range between 0.56 W and 4.6 W.

Compared to conventional PLD and MS deposition methods, the method allows, under optimized conditions, deposition of films with an increased density (for example, in the case of $TiO_2$ films grown on Si(100): density increased by about 20% for deposition at 5 mTorr with 7 W/cm² of RF power density applied to magnetron and 0.56 W of laser power with a smoothness two times higher than PLD-deposited films, and with an increased deposition rate (increased by up to about 50% compared to PLD and MS in isolation for $TiO_2$ films grown on Si(100) and epitaxial films of BFCO on LAO(100) as reported hereinabove). The method allows epitaxial growth of perovskites, including but not limited to multiferroic materials, on suitable substrates, under optimized conditions.

The scope of the claims should not be limited by the embodiments set forth in the examples, but should be given the broadest interpretation consistent with the description as a whole.

REFERENCES

1 Lowndes, D. H., Geohegan, D. B., Puretzky, A. A., Norton, D. P. & Rouleau, C. M. Synthesis of novel thin-film materials by pulsed laser deposition. Science 273, 898-903 (1996).
2 Li, X. et al. Large-area synthesis of high-quality and uniform graphene films on copper foils. Science 3893, 1312-1315 (2009).
3 Kim, K. S. et al. Large-scale pattern growth of graphene films for stretchable transparent electrodes. Nature 457, 706-710 (2009).
4 Craciun, V., Elders, J., Gardeniers, J. G. E. & Boyd, I. W. Characteristics of high quality ZnO thin films deposited by pulsed laser deposition. Appl. Phys. Lett. 65, 2963 (1994).
5 Dominé, D., Haug, F. J., Battaglia, C. & Ballif, C. Modeling of light scattering from micro- and nanotextured surfaces. J. Appl. Phys. 107, 044504 (2010).
6 Xi, J. Q. et al. Optical thin-film materials with low refractive index for broadband elimination of Fresnel reflection. Nat Photon 1, 176-179 (2007).
7 Kelly, P. & Arnell, R. Magnetron sputtering: a review of recent developments and applications. Vacuum 56, 159-172 (2000).
8 Willmott, P. & Huber, J. Pulsed laser vaporization and deposition. Rev. Mod. Phys. 72, 315-328 (2000).
9 Ashfold, M. N., Claeyssens, F., Fuge, G. M. & Henley, S. J. Pulsed laser ablation and deposition of thin films. Chem. Soc. Rev. 33, 23-31 (2004).
10 Chrisey, D. B. & Hubler, G. H. Pulsed Laser Deposition of Thin Films. (John Wiley & Sons, Inc., 1994).
11 Riabinina, D., Chaker, M. & Rosei, F. Correlation between plasma dynamics and porosity of Ge films synthesized by pulsed laser deposition. Appl. Phys. Lett. 89, 131501 (2006).
12 Paraguay, D. F., Estrada, L. W. & Acosta, N. D. Growth, structure and optical characterization of high quality ZnO thin films obtained by spray pyrolysis. Thin Solid Films 350, 192-202 (1999).
13 Helmersson, U., Lattemann, M., Bohlmark, J., Ehiasarian, A. P. & Gudmundsson, J. T. Ionized physical vapor deposition (IPVD): A review of technology and applications. Thin Solid Films 513, 1-24 (2006).
14 Sankur, H. O. & Gunning, W. Deposition of optical thin films by pulsed laser assisted evaporation. Appl. Opt. 28, 2806-2808 (1989).
15 Diserens, M., Patscheider, J. & Levy, F. Mechanical properties and oxidation resistance of nanocomposite TiN—SiN x physical-vapor-deposited thin films. Surf. Coat. Technol. 121, 158-165 (1999).
16 Schiller, S. et al. Pulsed magnetron sputter technology. Surf. Coat. Technol. 61, 331-337 (1993).
17 De Giacomo, A., Shakhatov, V., Senesi, G. S. & Orlando, S. Spectroscopic investigation of the method of plasma assisted pulsed laser deposition of titanium dioxide. Spectrochim. Acta B 56, 1459-1472 (2001).
18 Lorenz, M. et al. Large-area double-side pulsed laser deposition of YBa2Cu3O7-x thin films on 3-in. sapphire wafers. Appl. Phys. Lett. 68, 3332-3334 (1996).
19 Dietsch, R., Holz, T., Weißbach, D. & Scholz, R. Large area pulsed laser deposition (PLD) of nanometer-multilayers. Appl. Surf. Sci. 197-198, 169-174 (2002).
20 Voevodin, A., Capano, M., Safriet, A., Donley, M. & Zabinski, J. Combined magnetron sputtering and pulsed laser deposition of carbides and diamond-like carbon films. Appl. Phys. Lett. 69, 188-190 (1996).
21 Voevodin, A. A., Capano, M. A., Laube, S. J. P., Donley, M. S. & Zabinski, J. S. Design of a Ti/TiC/DLC functionally gradient coating based on studies of structural transitions in Ti—C thin films. Thin Solid Films 298, 107-115 (1997).
22 Hunter, C. N., Check, M. H., Muratore, C. & Voevodin, A. A. Electrostatic quadrupole plasma mass spectrometer measurements during thin film depositions using simultaneous matrix assisted pulsed laser evaporation and 23 Novotný, M., Buliř, J., Lančok, J. & Jelinek, M. A Comparison of Plasma in Laser and Hybrid Laser-Magnetron SiC Deposition Systems. Plasma Processes and Polymers 4, S1017-S1021 (2007).
24 Burmakov, A. P., Kuleshov, V. N. & Prokopchik, K. Y. Characteristic Features of the Formation of a Combined Magnetron-Laser Plasma in the Processes of Deposition of Film Coatings. Journal of Engineering Physics and Thermophysics 89, 1271-1276, (2016).
25 Voevodin, A. A., Hu, J. J., Jones, J. G., Fitz, T. A. & Zabinski, J. S. Growth and structural characterization of yttria-stabilized zirconia-gold nanocomposite films with improved toughness. Thin Solid Films 401, 187-195, (2001).
26 Endrino, J. L., Nainaparampil, J. J. & Krzanowski, J. E. Microstructure and vacuum tribology of TiC—Ag composite coatings deposited by magnetron sputtering-pulsed laser deposition. Surf. Coat. Technol. 157, 95-101 (2002).
27 Jelinek, M. et al. KrF laser deposition combined with magnetron sputtering to grow titanium-carbide layers. Thin Solid Films 506-507, 101-105, (2006).
28 Buliř, J., Novotný, M., Jelinek, M., Kocourek, T. & Studnička, V. Plasma study and deposition of DLC/TiC/Ti multilayer structures using method combining pulsed laser deposition and magnetron sputtering. Surf. Coat. Technol. 200, 708-711, (2005).
29 Jelinek, M., Kocourek, T., Zemek, J., Novotný, M. & Kadlec, J. Thin SiC x layers prepared by hybrid laser-magnetron deposition. Appl. Phys. A 93, 633, (2008).
30 Klotzbücher, T., Scherge, M., Mergens, M., Wesner, D. A. & Kreutz, E. W. Deposition of carbon nitride thin films in a hybrid r.f.-PLD method. Surf. Coat. Technol. 98, 1072-1078, (1998).
31 Klotzbücher, T., Mergens, M., Wesner, D. A. & Kreutz, E. W. C—BN thin film formation in a hybrid r.f.-PLD method. Diamond Relat. Mater. 6, 599-603, (1997). 2432
32 Yasaka, M. X-ray thin-film measurement methods. The Rigaku Journal 26 (2010).
33 P. Kienzle, NIST. Neutron activation and scattering calculator, www.ncnr.nist.gov/resources/activation/ (2014).
34 Nechache, R. & Rosei, F. Recent progress in nanostructured multiferroic Bi2FeCrO6 thin films. J. Solid State Chem. 189, 13-20 (2012).
35 Nechache, R., Harnagea, C. & Pignolet, A. Multiferroic properties-structure relationships in epitaxial Bi2FeCrO6 thin films: recent developments. J Phys Condens Matter 24, 096001 (2012).
36 Nechache, R. et al. Epitaxial thin films of the multiferroic double perovskite Bi2FeCrO6 grown on (100)-oriented SrTiO3 substrates: Growth, characterization, and optimization. J. Appl. Phys. 105, 061621 (2009).
37 Nechache, R. et al. Photovoltaic properties of Bi2FeCrO6 epitaxial thin films. Appl. Phys. Lett. 98, 202902 (2011).
38 Nechache, R. et al. Epitaxial patterning of Bi2FeCrO6 double perovskite nanostructures: multiferroic at room temperature. Adv. Mater. 23, 1724-1729 (2011).

The invention claimed is:

1. A hybrid method comprising magnetron sputtering and pulsed laser for film deposition on a substrate, comprising positioning a negatively biased target on a sputtering cathode of a magnetron, the sputtering cathode being located at a distance from the substrate, within a chamber with a plasma sputtering gas, and focusing a high intensity pulsed laser beam on the negatively biased target; wherein the method further comprises selecting an average laser power $P_{av-L}$ smaller than an average power applied to the magnetron $P_{av-M}$ as $P_{av-L} < P_{av-M}$ and a laser energy density above an ablation threshold of a material of the negatively biased target, for epitaxial growth of double perovskite $Bi_2FeCrO_6$ at a temperature of about 750° C. and a pressure of about 10 mTorr range, with an average laser power of about 4.4 W, a magnetron power of about 30 W, and an applied power density on the substrate of about 6 W/cm$^2$, on a $LaAlO_3$ substrate.

2. The method of claim 1, comprising adjusting an angle between the substrate and a direction perpendicular to the negatively biased target.

3. The method of claim 1, comprising electrically polarizing the substrate.

4. The method of claim 1, wherein the plasma sputtering gas comprises at least one of inert gases and reactive gas.

* * * * *